United States Patent [19]

Harari

[11] Patent Number: 5,583,812

[45] Date of Patent: Dec. 10, 1996

[54] FLASH EEPROM SYSTEM CELL ARRAY WITH MORE THAN TWO STORAGE STATES PER MEMORY CELL

[76] Inventor: Eliyahou Harari, 104 Auzerais Ct., Los Gatos, Calif. 95030

[21] Appl. No.: 389,295

[22] Filed: Feb. 16, 1995

Related U.S. Application Data

[60] Continuation of Ser. No. 116,867, Sep. 3, 1993, Pat. No. 5,434,825, which is a division of Ser. No. 563,287, Aug. 6, 1990, Pat. No. 5,268,870, which is a division of Ser. No. 380,854, Jul. 17, 1989, Pat. No. 5,043,940, which is a division of Ser. No. 204,175, Jun. 8, 1988, Pat. No. 5,095,344.

[51] Int. Cl.[6] ................................................. G11C 11/56
[52] U.S. Cl. .............. 365/185.33; 365/182; 365/185.03; 365/185.18; 365/185.19; 365/185.24; 365/185.22
[58] Field of Search ................................. 365/205, 182, 365/185, 218, 189.01, 230.01, 185.33, 185.03, 185.18, 185.19, 185.24, 185.22

[56] References Cited

U.S. PATENT DOCUMENTS

| | | |
|---|---|---|
| 4,051,354 | 9/1977 | Choate . |
| 4,087,795 | 5/1978 | Rossler . |
| 4,181,980 | 1/1980 | McCoy . |
| 4,279,024 | 7/1981 | Schrenk . |
| 4,281,398 | 7/1981 | McKenny et al. . |
| 4,287,570 | 9/1981 | Stark . |
| 4,357,685 | 11/1982 | Daniele et al. . |
| 4,448,400 | 6/1984 | Harari . |
| 4,493,075 | 1/1985 | Anderson et al. . |
| 4,527,251 | 7/1985 | Nibby, Jr., et al. . |
| 4,617,651 | 10/1986 | Ip et al. . |
| 4,652,897 | 3/1987 | Okuyama et al. . |
| 4,667,217 | 5/1987 | Janning . |
| 4,718,041 | 1/1988 | Baglee et al. . |
| 4,733,394 | 3/1988 | Giebel . |
| 4,942,556 | 7/1990 | Sasaki et al. . |
| 5,016,215 | 5/1991 | Tigelaar . |
| 5,043,940 | 8/1991 | Harari ...................................... 365/185 |
| 5,053,990 | 10/1991 | Kreifels et al. . |
| 5,163,021 | 11/1992 | Mehrotra et al. ........................ 365/185 |
| 5,268,870 | 12/1993 | Harari ...................................... 365/218 |
| 5,270,979 | 12/1993 | Harari et al. . |
| 5,293,560 | 3/1994 | Harari ...................................... 365/185 |
| 5,386,388 | 1/1995 | Atwood et al. .......................... 365/201 |
| 5,434,825 | 7/1995 | Harari ...................................... 365/185 |
| 5,450,363 | 9/1995 | Christopherson et al. .............. 365/205 |

FOREIGN PATENT DOCUMENTS

| | | |
|---|---|---|
| 0251889 | 1/1988 | European Pat. Off. . |
| 0349775 | 1/1990 | European Pat. Off. . |
| 54-158141 | 12/1979 | Japan . |
| 58-060493 | 4/1983 | Japan . |
| 58-086777 | 5/1983 | Japan . |
| 58-215795 | 12/1983 | Japan . |
| 58-215794 | 12/1983 | Japan . |
| 59-45695 | 3/1984 | Japan . |
| 59-162695 | 9/1984 | Japan . |
| 62-283497 | 12/1987 | Japan . |
| 62-283496 | 12/1987 | Japan . |
| 63-183700 | 7/1988 | Japan . |

OTHER PUBLICATIONS

"Japanese Develop Nondestructive Analog Semiconductor Memory", *Electronics Review*, Jul. 11, 1974, p. 29.

Krick, "Three–State MNOS FET Memory Array", *IBM Technical Disclosure Bulletin*, vol. 18, No. 12, May 1976, p. 4192.

Alberts et al., "Multi–Bit Storage FET EAROM Cell", *IBM Technical Disclosure Bulletin*, vol. 24, No. 7A, Dec. 1981, p. 3311.

Bleiker et al., "A Four–State EEPROM Using Floating–Gate Memory Cells", *IEEE Journal of Solid–State Circuits*, Jul. 1987, p. 260.

Horiguchi et al., "An Experimental Large–Capacity Semiconductor File Memory Using 16–Levels/Cell Storage", *IEEE Journal of Solid–State Circuits, Feb. 1988, p. 27.*

Furuyama et al., "An Experimental 2–Bit/Cell Storage DRAM for Macrocell or Memory–on–Logic Applications", *IEEE Custom Integrated Circuits Conference, May 1988, p. 4.4.1.*

Harold, "Production E.P.R.O.M. Loading", *New Electronics*, vol. 15, No. 3, Feb. 1982, pp. 47–50.

Torelli et al., "An Improved Method for Programming a Word–Erasable EEPROM", *Alta Frequenza*, vol. 52, No. 5, Nov. 1983, pp. 487–494.

Stark, "Two Bits Per Cell ROM," *Digest of Papers VLSI,* 1981, pp. 209–212.

*Primary Examiner*—Viet Q. Nguyen
*Attorney, Agent, or Firm*—Majestic, Parsons, Siebert & Hsue

[57] ABSTRACT

A memory system made up of electrically programmable read only memory (EPROM) or flash electrically erasable and programmable read only memory (EEPROM) cells. An intelligent programming technique allows each memory cell to store more than the usual one bit of information. More than one bit is stored in a cell by establishing more than two distinct threshold states into which the cell is programmed. A series of pulses of increasing voltage is applied to each addressed memory cell during its programming, the state of the cell being read in between pulses. The pulses are terminated upon the addressed cell reaching its desired state or a preset maximum number of pulses has been reached. An intelligent erase algorithm prolongs the useful life of the memory cells. A series of pulses is also applied to a block of cells being erased, the state of at least a sample number of cells being read in between pulses. The erasing process is stopped when the cells being read are determined to have reached a fully erased state or one of a number of other conditions has occurred. Individual records of the number of erase cycles experienced by blocks of flash EEPROM cells are kept, preferable as part of the blocks themselves, in order to maintain an endurance history of the cells within the blocks. Use of these various features provides a memory having a very high storage density and a long life, making it particularly useful as a solid state memory in place of magnetic disk storage devices in computer systems.

34 Claims, 5 Drawing Sheets

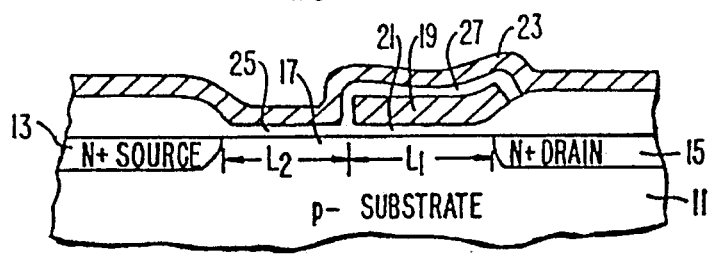
FIG._1.
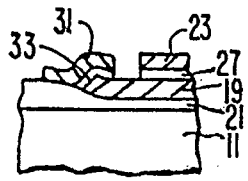
FIG._1a.
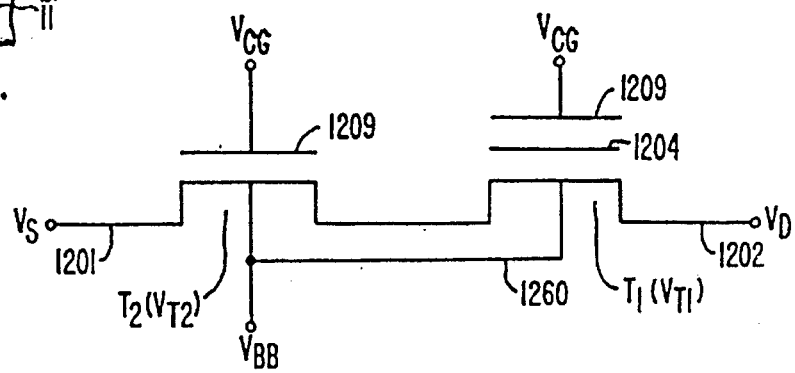
FIG._2a.
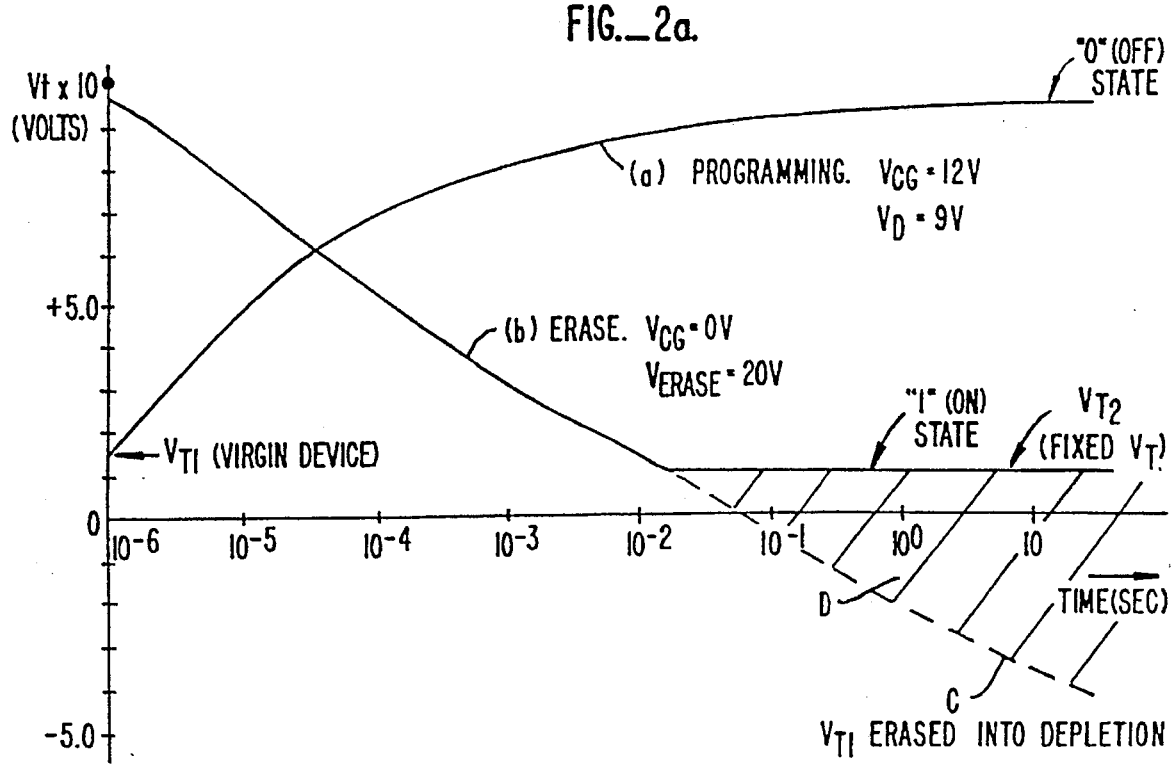
FIG._2b.

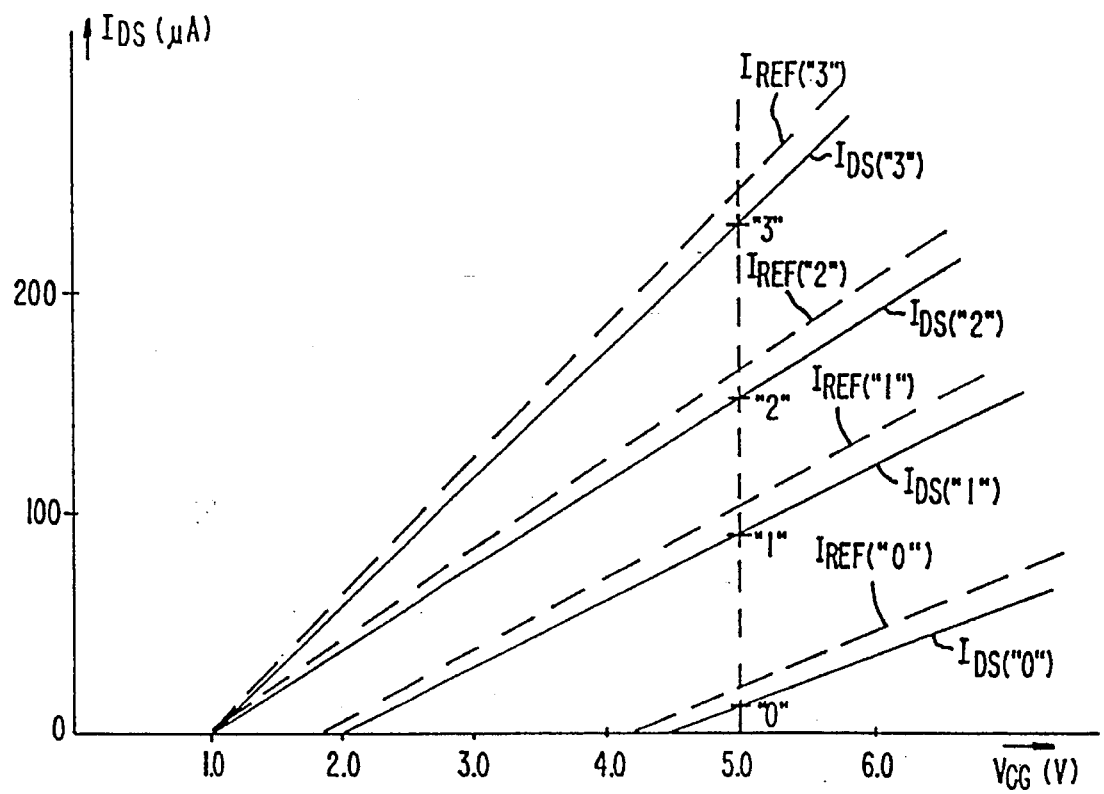
FIG._2c.
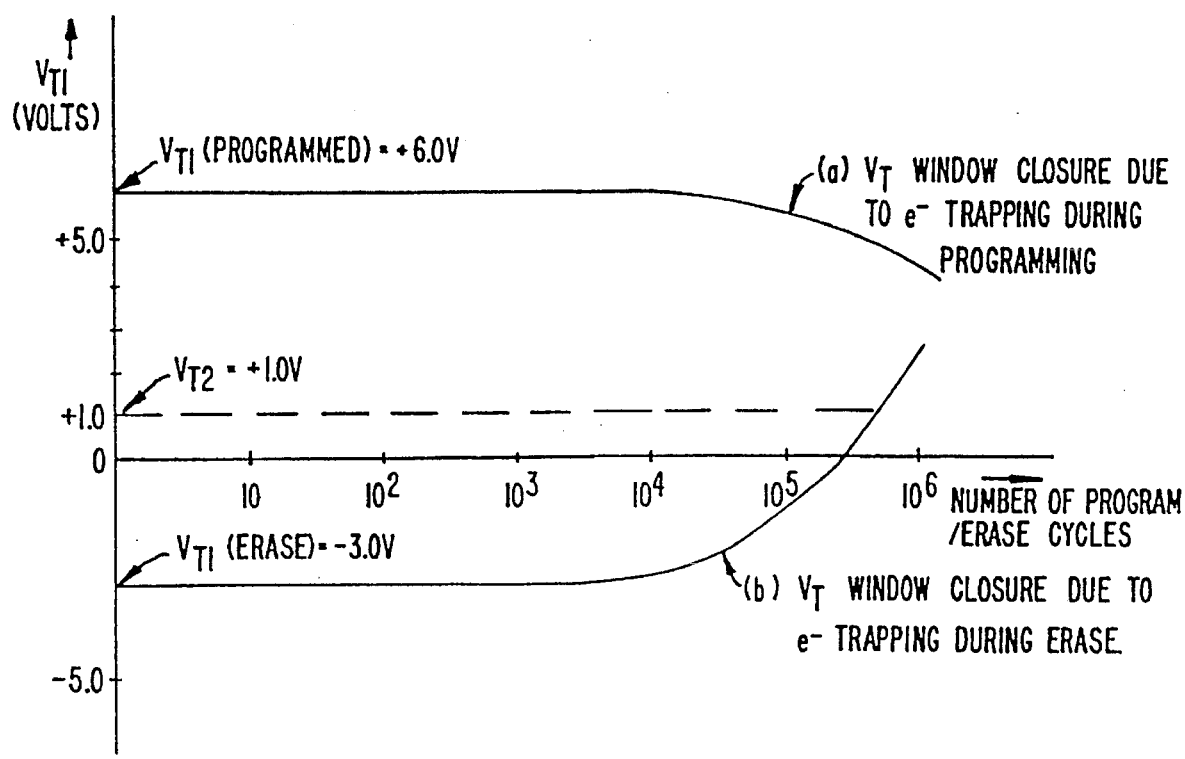
FIG._2d.

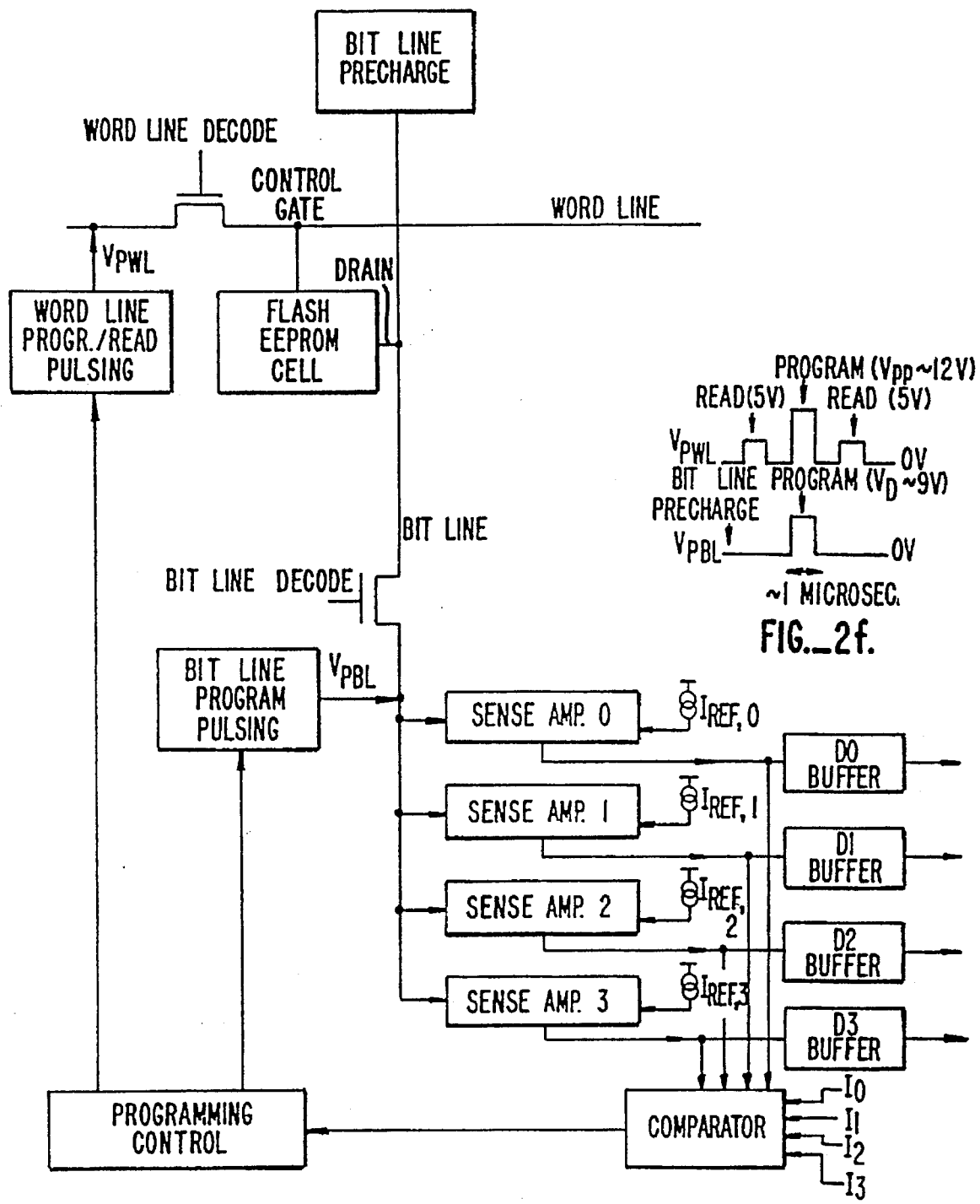
FIG._2e.

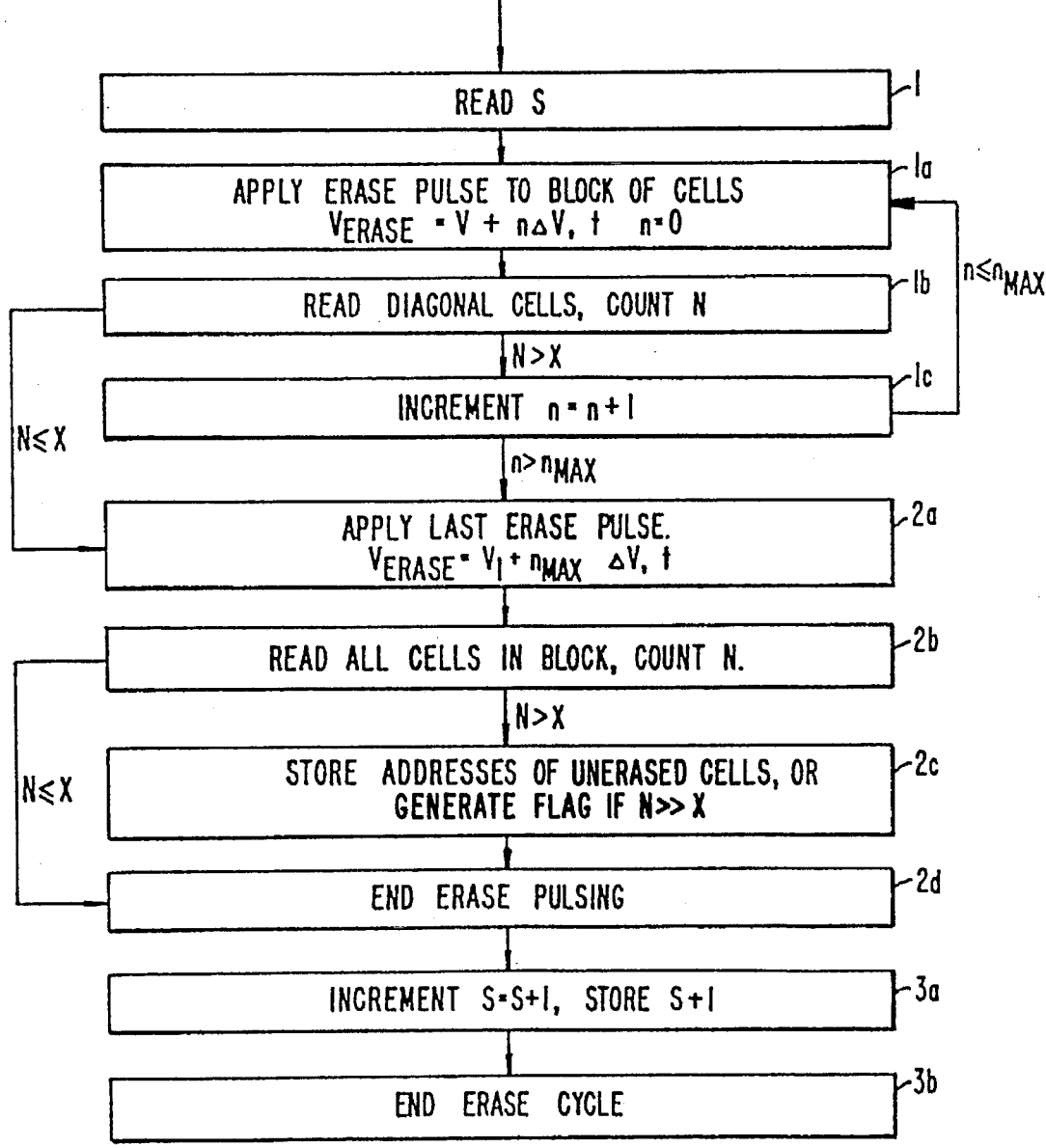
FIG._3.

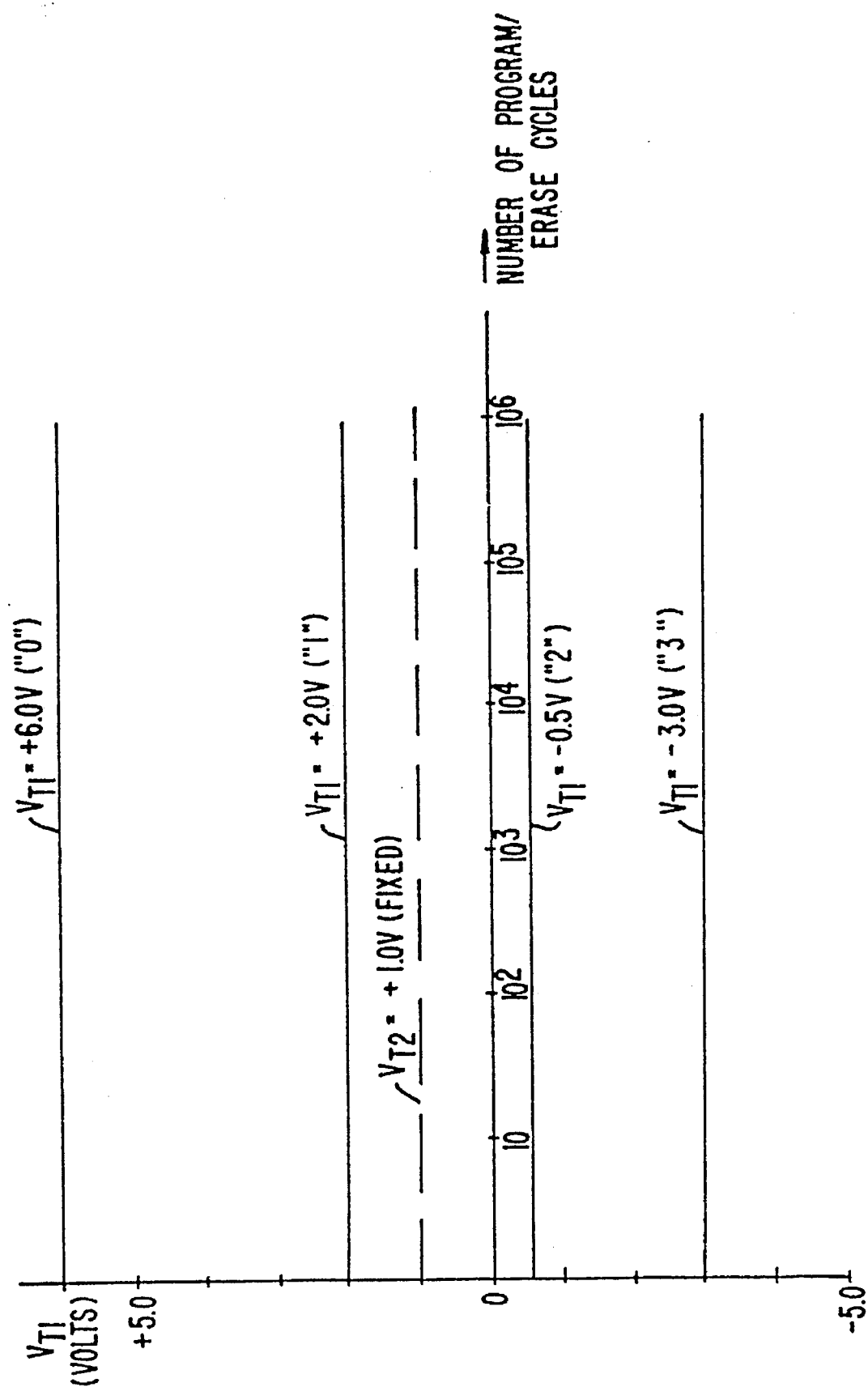
FIG._4.

FLASH EEPROM SYSTEM CELL ARRAY WITH MORE THAN TWO STORAGE STATES PER MEMORY CELL

CROSS-REFERENCE TO RELATED APPLICATION

This application is a continuation of application Ser. No. 08/116,867, filed Sep. 3, 1993, now U.S. Pat. No. 5,434,825, which is a division of application Ser. No. 07/563,287, filed Aug. 6, 1990, now U.S. Pat. No. 5,268,870, which in turn is a division of application Ser. No. 07/380,854, filed Jul. 17, 1989, now U.S. Pat. No. 5,043,940, which in turn is a division of application Ser. No. 07/204,175, filed Jun. 8, 1988, now U.S. Pat. No. 5,095,344.

BACKGROUND OF THE INVENTION

This invention relates generally to semiconductor electrically programmable read only memories (EPROM) and electrically erasable programmable read only memories (EEPROM), and specifically to techniques for using them.

An electrically programmable read only memory (EPROM) utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. A transistor is programmed to one of two states by accelerating electrons from the substrate channel region, through a thin gate dielectric and onto the floating gate.

The memory cell transistor's state is read by placing an operating voltage across its source and drain and on its control gate, and then detecting the level of current flowing between the source and drain as to whether the device is programmed to be "on" or "off" at the control gate voltage selected. A specific, single cell in a two-dimensional array of EPROM cells is addressed for reading by application of a source-drain voltage to source and drain lines in a column containing the cell being addressed, and application of a control gate voltage to the control gates in a row containing the cell being addressed.

One example of such a memory cell is a triple polysilicon, split channel electrically erasable and programmable read only memory (EEPROM). It is termed a "split channel" device since the floating and control gates extend over adjacent portions of the channel. This results in a transistor structure that operates as two transistors in series, one having a varying threshold in response to the charge level on the floating gate, and another that is unaffected by the floating gate charge but rather which operates in response to the voltage on the control gate as in any normal field effect transistor.

Such a memory cell is termed, a "triple polysilicon" cell because it contains three conductive layers of polysilicon materials. In addition to the floating and control gates, an erase gate is included. The erase gate passes through each memory cell transistor closely adjacent to a surface of the floating gate but insulated therefrom by a thin tunnel dielectric. Charge is then removed from the floating gate of a cell to the erase gate, when appropriate voltages are applied to all the transistor elements. An array of EEPROM cells are generally referred to as a Flash EEPROM array if an entire array of cells, or a significant group of cells, is erased simultaneously (i.e., in a flash).

EEPROM have been found to have a limited effective life. The number of cycles of programming and erasing that such a device can endure before becoming degraded is finite. After a number of such cycles in excess of 10,000, depending upon its specific structure, its programmability can be reduced. Often, by the time the device has been put through such a cycle for over 100,000 times, it can no longer be programmed or erased properly. This is believed to be the result of electrons being trapped in the dielectric each time charge is transferred to or away from the floating gate by programming or erasing, respectively.

It is a primary object of the present invention to provide an EEPROM array with increased storage capacity and life.

Further, it is an object of the present invention to provide techniques for increasing the number of program/erase cycles that an EEPROM can endure.

Another object of the present invention is to provide techniques for increasing the amount of information that can be stored in a given size EPROM or EEPROM array.

It is yet another object of the present invention to provide EEPROM semiconductor chips that are useful for solid state memory to replace magnetic disk storage devices.

SUMMARY OF THE INVENTION

These and additional objects are accomplished by the various aspects of the present invention, wherein, briefly and generally, each EPROM or EEPROM memory cell is caused to store more than one bit of data by partitioning its programmed charge into three or more ranges. Each cell is then programmed into one of these ranges. If four ranges are used, two bits of data can be stored in a single cell. If eight ranges are designated, three bits can be stored, and so on.

An intelligent programming and sensing technique is provided which permits the practical implementation of such multiple state storage. Further, an intelligent erase algorithm is provided which results in a significant reduction in the electrical stress experienced by the erase tunnel dielectric and results in much higher endurance to program/erase cycling and a resulting increased life of the memory.

Additional objects, features and advantages of the present invention will be understood from the following description of its preferred embodiments, which description should be taken in conjunction with the accompanying drawings.

BRIEF DESCRIPTION OF THE DRAWINGS

FIG. 1 is a cross section of an example split channel EPROM or EEPROM.

FIG. 1a is a cross-sectional view of a Flash EEPROM cell.

FIG. 2a is a schematic representation of the composite transistor forming a split channel EPROM device.

FIG. 2b shows the programming and erase characteristics of a split channel Flash EEPROM device.

FIG. 2c shows the four conduction states of a split channel Flash EEPROM device in accordance with this invention.

FIG. 2d shows the program/erase cycling endurance characteristics of prior art Flash EEPROM devices.

FIGS. 2e and 2f show a circuit schematic and programming/read voltage pulses required to implement multistate storage.

FIG. 3 outlines the key steps in the new algorithm used to erase with a minimum stress.

FIG. 4 shows the program/erase cycling endurance characteristics of the split channel Flash EEPROM device using intelligent algorithms for multistate programming and for reduced stress during erasing.

DESCRIPTION OF THE PREFERRED EMBODIMENTS

Referring initially to FIG. 1, the structure of a split-channel EPROM or EEPROM cell is described that is suitable for use in the improved memory array and operation of the present invention. A semiconductor substrate 11 includes source region 13 and drain region 15, usually formed by ion implantation. Between the source and drain is a channel region 17. Over a portion of the channel region designated as L1 is a floating gate 19, separated from the substrate by a thin layer of gate oxide 21. Over a portion of the channel region designated as L2 is formed a control gate 23, separated from the substrate 11 by a thin gate oxide layer 25. The control gate 23 is also electrically isolated from the floating gate 19 by an oxide layer 27.

It is the amount of electrical charge on the floating gate 19 that is programmed in accordance with the state desired to be stored in the cell. If the charge level is above some set threshold, the cell is considered to be in one state. If below that threshold, it is designated to be in its other state. The desired charge level is programmed by applying an appropriate combination of voltages to the source, drain, substrate and control gate, for a designated period of time, in order to cause electrons to move from the substrate 11 to the floating gate 19.

The floating gate is confined to its one memory cell and is electrically isolated from all other parts of the structure. The control gate 23, on the other hand, extends across a large number of cells sharing a common word line. As described hereinafter, the split-channel has the effect of providing two field-effect-transistors in series, one with the floating gate 19 and the control gate 23 controlling conduction of its channel and the other with the control gate 23 alone controlling conduction of its channel.

The generic split-channel EPROM or EEPROM structure of FIG. 1 becomes a Flash EEPROM device when an erase gate 31 (FIG. 1a) is added. The erase gate is a separate electrode positioned near a portion of the floating gate 27 and separated from it by a tunnel dielectric 33. When the proper voltages are applied to the source, drain, substrate, control gate and erase gate, the amount of charge on the floating gate is reduced. A single erase gate extends to a large number of memory cells, if not the entire array, so that they may be erased all at once. In some prior art Flash EEPROM cells the source or drain diffusions underneath the floating gate are used also as the erase electrode, while in other cells the erase electrode is implemented either in the same conductive layer as the control gate or in a separate conductive layer.

Multistate Storage

The split channel Flash EEPROM device can be viewed as a composite transistor consisting of two transistors T1 and T2 in series—FIG. 2a. Transistor T1 is a floating gate transistor of effective channel length L1 and having a variable threshold voltage $V_{T1}$. Transistor T2 has a fixed (enhancement) threshold voltage $V_{T2}$ and an effective channel length L2. The EPROM programming characteristics of the composite transistor are shown in curve (a) of FIG. 2b. The programmed threshold voltage $V_{tx}$ is plotted as a function of the time t during which the programming conditions are applied. These programming conditions typically are $V_{CG}$=12 V, $V_D$=9 V, $V_S$=$V_{BB}$=0V, where $V_{BB}$ is the substrate voltage. No programming can occur if either one of $V_{CG}$ or $V_D$ is at 0V. A virgin (unprogrammed, unerased) device has $V_{T1}$=+1.5 V and $V_{T2}$=+1.0 V. After programming for approximately 100 microseconds the device reaches a threshold voltage $V_{tx} \geq +6.0$ volts. This represents the off ("0") state because the composite device does not conduct at $V_{CG}$=+5.0 V. Prior art devices employ a so called "intelligent programming" algorithm whereby programming pulses are applied, each of typically 100 microseconds to 1 millisecond duration, followed by a sensing (read) operation. Pulses are applied until the device is sensed to be fully in the off state, and then one to three more programming pulses are applied to ensure solid programmability.

Prior art split channel Flash EEPROM devices erase with a single pulse of sufficient voltage $V_{ERASE}$ and sufficient duration to ensure that $V_{T1}$ is erased to a voltage below $V_{T2}$ (curve (b) in FIG. 2b). Although the floating gate transistor may continue to erase into depletion mode operation (line (c) in FIG. 2b), the presence of the series T2 transistor obscures this depletion threshold voltage. Therefore the erased on ("1") state is represented by the threshold voltage $V_{tx}$=$V_{T2}$=+1.0 V. The memory storage "window" is given by $\Delta V = V_{tx}("0") - V_{tx}("1") = 6.0 - 1.0 = 5.0$ V. However, the true memory storage window should be represented by the full swing of $V_{tx}$ for transistor T1. For example, if T1 is erased into depletion threshold voltage $V_{T1}$=−3.0 V, then the true window should be given by −$\Delta V$=6.0−(−3.0)=9.0 V. None of the prior art Flash EEPROM devices take advantage of the true memory window. In fact they ignore altogether the region of device operation (hatched region D in FIG. 2b) where $V_{T1}$ is more negative than $V_{T2}$.

This invention proposes for the first time a scheme to take advantage of the full memory window. This is done by using the wider memory window to store more than two binary states and therefore more than a single bit per cell. For example, it is possible to store 4, rather than 2 states per cell, with these states having the following threshold voltage:

State "3": $V_{T1}$=−3.0 V, $V_{T2}$=+1.0 V (highest conduction)=1, 1.

State "2": $V_{T1}$=−0.5 V, $V_{T2}$=+1.0 V (intermediate conduction)=1, 0.

State "1": $V_{T1}$=+2.0 V, $V_{T2}$=+1.0 V (lower conduction)=0, 1.

State "0": $V_{T1}$=+4.5 V, $V_{T2}$=+1.0 V (no conduction)=0, 0.

To sense any one of these four states, the control gate is raised to $V_{CG}$=+5.0 V and the source-drain current $I_{DS}$ is sensed through the composite device. Since $V_{T2}$=+1.0 V for all four threshold states transistor T2 behaves simply as a series resistor. The conduction current $I_{DS}$ of the composite transistor for all 4 states is shown as a function of $V_{CG}$ in FIG. 2c. A current sensing amplifier is capable of easily distinguishing between these four conduction states. The maximum number of states which is realistically feasible is influenced by the noise sensitivity of the sense amplifier as well as by any charge loss which can be expected over time at elevated temperatures. Eight distinct conduction states are necessary for 3 bit storage per cell, and 16 distinct conduction states are required for 4 bit storage per cell.

Multistate memory cells have previously been proposed in conjunction with ROM (Read Only Memory) devices and DRAM (Dynamic Random Access Memory). In ROM, each storage transistor can have one of several fixed conduction states by having different channel ion implant doses to establish more than two permanent threshold voltage states. Prior art multistate DRAM cells have also been proposed where each cell in the array is physically identical to all other cells. However, the charge stored at the capacitor of each cell may be quantized, resulting in several distinct read signal levels. An example of such prior art multistate DRAM storage is described in *IEEE Journal of Solid-State Circuits*, February 1988, p. 27 in an article by M. Horiguchi et al. entitled "An Experimental Large-Capacity Semiconductor File Memory Using 16-Levels/Cell Storage". A second example of prior art multistate DRAM is provided in *IEEE Custom Integrated Circuits Conference*, May 1988, p. 4.4.1 in an article entitled "An Experimental 2-Bit/Cell Storage DRAM for Macrocell or Memory-on-Logic Applications" by T. Furuyama et al.

To take full advantage of multistate storage in EPROMS it is necessary that the programming algorithm allow programming of the device into any one of several conduction states. First it is required that the device be erased to a voltage $V_{T1}$ more negative than the "3" state (−3.0 V in this example). Then the device is programmed in a short programming pulse, typically one to ten microseconds in duration. Programming conditions are selected such that no single pulse can shift the device threshold by more than one half of the threshold voltage difference between two successive states. The device is then sensed by comparing its conduction current $I_{DS}$ with that of a reference current source $I_{REF}$, i (i=0,1,2,3) corresponding to the desired conduction state (four distinct reference levels must be provided corresponding to the four states). Programming pulses are continued until the sensed current (solid lines in FIG. 2c) drops slightly below the reference current corresponding to the desired one of four states (dashed lines in FIG. 2c). To better illustrate this point, assume that each programming pulse raises $V_{tx}$ linearly by 200 millivolts, and assume further that the device was first erased to $V_{T1}$=−3.2 V. Then the number of programming/sensing pulses required is:

For state "3" ($V_{T1}$=−3.0 V) No. of pulses=(3.2−3.0)/0.2=1

For state "2" ($V_{T1}$=−0.5 V) No. of pulses=(3.2−0.5)/0.2= 14

For state "1" ($V_{T1}$=+2.0 V) No. of pulses=(3.2−(−2.0))/0.2=26 and for state "0" ($V_{T1}$=+4.5 V) No. of pulses=(3.2−(−4.5))/0.2=39.

In actual fact shifts in $V_{tx}$ are not linear in time, as shown in FIG. 2b (curve (a)), therefore requiring more pulses than indicated for states "1" and "0". If 2 microseconds is the programming pulse width and 0.1 microseconds is the time required for sensing, then the maximum time required to program the device into any of the 4 states is approximately (39)2+(39)0,1=81.9 microseconds. This is less than the time required by "intelligent programming algorithms" of prior art devices. In fact, with the new programming algorithm only carefully metered packets of electrons are injected during programming. A further benefit of this approach is that the sensing during reading is the same sensing as that during programming/sensing, and the same reference current sources are used in both programming and reading operations. That means that each and every memory cell in the array is read relative to the same reference level as used during program/sense. This provides excellent tracking even in very large memory arrays.

Large memory systems typically incorporate error detection and correction schemes which can tolerate a small number of hard failures i.e. bad Flash EEPROM cells. For this reason the programming/sensing cycling algorithm can be automatically halted after a certain maximum number of programming cycles has been applied even if the cell being programmed has not reached the desired threshold voltage state, indicating a faulty memory cell.

There are several ways to implement the multistate storage concept in conjunction with an array of Flash EEPROM transistors. An example of one such circuit is shown in FIG. 2e. In this circuit an array of memory cells has decoded word lines and decoded bit lines connected to the control gates and drains respectively of rows and columns of cells. FIG. 2f shows voltages $V_{PWL}$ and $V_{PBL}$ during operation of the circuit of FIG. 2e. Each bit line is normally precharged to a voltage of between 1.0 V and 2.0 V during the time between read, program or erase. For a four state storage, four sense amplifiers, each with its own distinct current reference levels IREF,0, IREF,1, IREF,2, and IREF,3 are attached to each decoded output of the bit line. During read, the current through the Flash EEPROM transistor is compared simultaneously (i.e., in parallel) with these four reference levels (this operation can also be performed in four consecutive read cycles using a single sense amplifier with a different reference applied at each cycle, if the attendant additional time required for reading is not a concern). The data output is provided from the four sense amplifiers through four Di buffers (D0, D1, D2 and D3).

During programming, the four data inputs Ii (I0, I1, I2 and I3) are presented to a comparator circuit which also has presented to it the four sense amp outputs for the accessed cell. If Di match Ii, then the cell is in the correct state and no programming is required. If however all four Di do not match all four Ii, then the comparator output activates a programming control circuit. This circuit in turn controls the bit line (VPBL) and word line (VPWL) programming pulse generators. A single short programming pulse is applied to both the selected word line and the selected bit line. This is followed by a second read cycle to determine if a match between Di and Ii has been established. This sequence is repeated through multiple programming/reading pulses and is stopped only when a match is established (or earlier if no match has been established but after a preset maximum number of pulses has been reached).

The result of such multistate programming algorithm is that each cell is programmed into any one of the four conduction states in direct correlation with the reference conduction states $I_{REF}$, i. In fact, the same sense amplifiers used during programming/reading pulsing are also used during sensing (i.e., during normal reading). This allows excellent tracking between the reference levels (dashed lines in FIG. 2c) and the programmed conduction levels (solid lines in FIG. 2c), across large memory arrays and also for a very wide range of operating temperatures. Furthermore, because only a carefully metered number of electrons is introduced onto the floating gate during programming or removed during erasing, the device experiences the minimum amount of endurance-related stress possible.

In actual fact, although four reference levels and four sense amplifiers are used to program the cell into one of four distinct conduction states, only three sense amplifiers and three reference levels are required to sense the correct one of four stored states. For example, in FIG. 2c, $I_{REF}$("2") can differentiate correctly between conduction states "3" and "2", $I_{REF}$("1") can differentiate correctly between conduction states "2" and "1", and $I_{REF}$("0") can differentiate correctly between conduction states "1" and "0". In a practical implementation of the circuit of FIG. 2e the reference levels $I_{REF}$, i (i=0,1,2) may be somewhat shifted by a fixed amount during sensing to place them closer to the midpoint between the corresponding lower and higher conduction states of the cell being sensed.

Note that the same principle employed in the circuit of FIG. 2e can be used also with binary storage, or with storage of more than four states per cell. Of course, circuits other than the one shown in FIG. 2e are also possible. For example, voltage level sensing rather than conduction level sensing can be employed.

Improved Charge Retention

In the example above, states "3" and "2" are the result of net positive charge (holes) on the floating gate while states "1" and "0" are the result of net negative charge (electrons) on the floating gate. To properly sense the correct conduction state during the lifetime of the device (which may be specified as 10 years at 125 degrees centigrade) it is necessary for this charge not to leak off the floating gate by more than the equivalent of approximately 200 millivolts shift in $V_{T1}$. This condition is readily met for stored electrons in this as well as all prior art EPROM and Flash EEPROM devices. From device physics considerations, retention of holes trapped on the floating gate should be significantly superior to the retention of trapped electrons. This is so because trapped holes can only be neutralized by the injection of electrons onto the floating gate. So long as the conditions for such injection do not exist, it is almost impossible for the holes to overcome the potential barrier of approximately 5.0 electron volts at the silicon-silicon dioxide interface (compared to a 3.1 electron volt potential barrier for trapped electrons).

Therefore, it is possible to improve the retention of this device by assigning more of the conduction states to states which involve trapped holes. For example, in the example above state "1" had $V_{T1}=+2.0$ V, which involved trapped electrons since $V_{T1}$ for the virgin device was made to be $V_{T1}=+1.5$ V. If, however, $V_{T1}$ of the virgin device is raised to a higher threshold voltage, say to $V_{T1}=+3.0$ V (e.g. by increasing the p-type doping concentration in the channel region 17 in FIG. 1), then the same state "1" with $V_{T1}=+2.0$ V will involve trapped holes, and will therefore better retain this value of $V_{T1}$. Of course, it is also possible to set the reference levels so that most or all states will have values of $V_{T1}$ which are lower than the $V_{T1}$ of the virgin device.

Intelligent Erase for Improved Endurance

The endurance of Flash EEPROM devices is their ability to withstand a given number of program/erase cycles. The physical phenomenon limiting the endurance of prior art Flash EEPROM devices is trapping of electrons in the active dielectric films of the device. During programming, the dielectric used during hot electron channel injection traps part of the injected electrons. During erasing, the tunnel erase dielectric likewise traps some of the tunneled electrons. The trapped electrons oppose the applied electric field in subsequent write/erase cycles thereby causing a reduction in the threshold voltage shift of $V_{tx}$. This can be seen in a gradual closure (FIG. 2d) in the voltage "window" between the "0" and "1" states. Beyond approximately $1\times10^4$ program/erase cycles, the window closure can become sufficiently severe to cause the sensing circuitry to malfunction. If cycling is continued, the device eventually experiences catastrophic failure due to a ruptured dielectric. This typically occurs at between $1\times10^6$ and $1\times10^7$ cycles, and is known as the intrinsic breakdown of the device. In memory arrays of prior art devices the window closure is what limits the practical endurance to approximately $1\times10^4$ cycles. At a given erase voltage, $V_{ERASE}$, the time required to adequately erase the device can stretch out from 100 milliseconds initially (i.e. in a virgin device) to 10 seconds in a device which has been cycled through $1\times10^4$ cycles. In anticipation of such degradation, prior art Flash EEPROM devices specified to withstand $1\times10^4$ cycles must specify a sufficiently long erase pulse duration to allow proper erase after $1\times10^4$ cycles. However, this also results in virgin devices being overerased and therefore being unnecessarily overstressed.

A second problem with prior art devices is that during the erase pulse the tunnel dielectric may be exposed to an excessively high peak stress. This occurs in a device which has previously been programmed to state "0" ($V_{T1}=+4.5$ V or higher). This device has a large negative charge Q. When $V_{ERASE}$ is applied, the tunnel dielectric is momentarily exposed to a peak electric field with contributions from $V_{ERASE}$ as well as from Q. This peak field is eventually reduced when Q is reduced to zero as a consequence of the tunnel erase. Nevertheless, permanent and cumulative damage is inflicted through this erase procedure, which brings about premature device failure.

To overcome the two problems of overstress and window closure, a new erase algorithm is disclosed, which can also be applied equally well to any prior art Flash EEPROM device. Without such new erase algorithm, it would be difficult to have a multistate device since, from curve (b) in FIG. 2d, conduction states having $V_{T1}$ more negative than $V_{T2}$ may be eliminated after $1\times10^4$ to $1\times10^5$ write/erase cycles.

FIG. 3 outlines the main steps in the sequence of the new erase algorithm. Assume that a block array of m×n memory cells is to be fully erased (Flash erase) to state "3" (highest conductivity and lowest $V_{T1}$ state). Certain parameters are established in conjunction with the erase algorithm. They are listed in FIG. 3: $V_1$ is the erase voltage of the first erase pulse. $V_1$ is lower by perhaps 5 volts from the erase voltage required to erase a virgin device to state "3" in a one second erase pulse. t is chosen to be approximately 1/10th of the time required to fully erase a virgin device to state "3". Typically, $V_1$ may be between 10 and 20 volts while t may be between 10 and 100 milliseconds. The algorithm assumes that a certain small number, X, of bad bits can be tolerated by the system (through for example error detection and correction schemes implemented at the system level. If no error detection and correction is implemented then X=0). These would be bits which may have a shorted or leaky tunnel dielectric which prevents them from being erased even after a very long erase pulse. To avoid excessive erasing the total number of erase pulses in a complete block erase cycling can be limited to a preset number, $n_{max}$. $\Delta V$ is the voltage by which each successive erase pulse is incremented. Typically, $\Delta V$ is in the range between 0.25 V and 1.0 V. For example, if $V_1=15.0$ V and $\Delta V=1.0$ V, then the seventh erase pulse will be of magnitude $V_{ERASE}=21.0$ V and duration t. A cell is considered to be fully erased when its read conductance is greater than $I_{-3-}$. The number S (an experience number) of complete erase cyclings experienced by each block is an important information at the system level. If S is known for each block then a block can be replaced automatically with a new redundant block once S reaches $1\times10^6$ (or any other set number) of program/erase cycles. S is set at zero initially, and is incremented by one for each complete block erase multiple pulse cycle. The value of S at any one time can be stored by using for example twenty bits ($2^{20}$ equals approximately $1\times10^6$) in each block. That way each block carries its own endurance history. Alternatively the S value can be stored off chip as part of the system.

The sequence for a complete erase cycle of the new algorithm is as follows (see FIG. 3):

1. Read S. This value can be stored in a register file. (This step can be omitted if S is not expected to approach the endurance limit during the operating lifetime of the device).

1a. Apply a first erase pulse with $V_{ERASE}=V_1+n\,\Delta V$, n=0, pulse duration=t. This pulse (and the next few successive pulses) is insufficient to fully erase all memory cells, but it serves to reduce the charge Q on programmed cells at a relatively low erase field stress, i.e., it is equivalent to a "conditioning" pulse.

1b. Read a sparse pattern or selected number of cells in the array. A diagonal read pattern for example will read substantially less than all (m×n) cells required for a complete read, and will have at least one cell from each row and one cell from each column in the array. The number N of cells not fully erased to state "3" is counted and compared with X.

1c. If N is greater than x (array not adequately erased) a second erase pulse is applied of magnitude greater by $\Delta V$ than the magnitude of the first pulse, with the same pulse duration, t. Read diagonal cells, count N.

This cycling of erase pulse/read/increment erase pulse is continued until either $N \leq X$, the number n of erase pulses exceed $n_{max}$, the threshold level of each of the addressed cells has reached an erased state, or a predetermined maximum voltage $V_{ERASE}$ of the erase pulse has been reached. The first one of these two conditions to occur leads to a final erase pulse.

2a. The final erase pulse is applied to assure that the array is solidly and fully erased. The magnitude of $V_{ERASE}$ can be the same as in the previous pulse or higher by another increment $\Delta V$. The duration can be between 1 t and 5 t.

2b. 100% of the array is read. The number N of cells not fully erased is counted. If N is less than or equal to X, then the erase pulsing is completed at this point.

2c. If N is greater than X, then address locations of the N unerased cells are generated, possibly for substitution with redundant good bits at the system level. If N is significantly larger than X (for example, if N exceeds a second number of cells such that N represents perhaps 5% of the total number of cells), then a flag may be raised, to indicate to the user that the array may have reached its endurance of limit.

2d. Erase pulsing is ended.

3a. S is incremented by one and the new S is stored for future reference. This step is optional. The new S can be stored either by writing it into the newly erased block or off chip in a separate register file.

3b. The erase cycle is ended. The complete cycle is expected to be completed with between 10 to 20 erase pulses and to last a total of approximately one second.

The new algorithm has the following advantages:

(a) No cell in the array experiences the peak electric field stress. By the time $V_{ERASE}$ is incremented to a relatively high voltage any charge Q on the floating gates has already been removed in previous lower voltage erase pulses.

(b) The total erase time is significantly shorter than the fixed $V_{ERASE}$ pulse of the prior art. Virgin devices see the minimum pulse duration necessary to erase. Devices which have undergone more than $1\times10^4$ cycles require only several more $\Delta V$ voltage increments to overcome dielectric trapped charge, which only adds several hundred milliseconds to their total erase time.

(c) The window closure on the erase side (curve (b) in FIG. 2d) is avoided indefinitely (until the device experiences failure by a catastrophic breakdown) because $V_{ERASE}$ is simply incremented until the device is erased properly to state "3". Thus, the new erase algorithm preserves the full memory window.

FIG. 4 shows the four conduction states of the Flash EEPROM devices of this invention as a function of the number of program/erase cycles. Since all four states are always accomplished by programming or erasing to fixed reference conduction states, there is no window closure for any of these states at least until $1\times10^6$ cycles.

In a Flash EEPROM memory chip, it is possible to implement efficiently the new erase algorithm by providing on chip (or alternatively on a separate controller chip) a voltage multiplier to provide the necessary voltage V1 and voltage increments $\Delta V$ to $n\Delta V$, timing circuitry to time the erase and sense pulse duration, counting circuitry to count N and compare it with the stored value for X, registers to store address locations of bad bits, and control and sequencing circuitry, including the instruction set to execute the erase sequence outlined above.

While the embodiments of this invention that have been described are the preferred implementations, those skilled in the art will understand that variations thereof may also be possible. Therefore, the invention is entitled to protection within the full scope of the appended claims.

It is claimed:

1. For an array of electrically alterable memory cells that are addressable for altering and reading their states, wherein the memory cells individually include a field effect transistor with a floating gate and has a threshold voltage level that is a given level in the absence of net charge on said floating gate but which is variable in accordance with an amount of net charge carried by said floating gate, a method of altering the state of an addressed cell of the array, comprising:

establishing a plurality of effective threshold voltage levels in excess of two that correspond to a plurality of individually detectable states of the cell in excess of two, wherein at least two of said plurality of effective threshold levels result from a net positive charge on the floating gate, and setting the addressed call to one of said plurality of detectable states by altering the amount of charge on the floating gate of the addressed cell until the effective threshold voltage of the addressed cell is substantially equal to one of said plurality of effective threshold voltage levels.

2. The method of claim 1 wherein setting the addressed cell to one of said plurality of detectable states includes altering the effective threshold voltage level of the addressed cell by adding negative charge to the floating gate of the addressed cell.

3. The method of claim 1 which additionally comprises presetting the effective threshold voltage of the addressed cell to a preset level before setting the addressed cell to one of said plurality of detectable states.

4. The method of claim 1 which additionally comprises, before setting the addressed cell to one of said plurality of detectable states, presetting to a preset level the effective threshold voltage level of a group of cells within the array that includes the addressed cell by altering the amount of charge on the floating gates of individual ones of the group of cells.

5. The method of claim 4 wherein the presetting of the group of cells includes presetting the group of cells to a preset effective threshold voltage level that is outside a range of said plurality of effective threshold voltage levels.

6. The method of claim 4 wherein the presetting of the group of cells includes establishing the preset effective threshold voltage level of the group of cells at a level lower than the lowest of said plurality of effective threshold voltage levels corresponding to the plurality of states of the cell by removing negative charge from the floating gate, and the setting of the detectable state of the addressed cell includes adding negative charge to the floating gate of the addressed cell.

7. The method of claim 4 which additionally comprises, after setting the addressed cell to one of said plurality of detectable states, reading the state to which the addressed cell was set.

8. The method of claim 7 wherein the reading of the state to which the addressed cell was set includes causing electrical current to flow through the addressed cell and simultaneously comparing a level of said current with two or more reference current levels.

9. The method of claim 1 which additionally comprises, after setting addressed cell to one of said plurality of the detectable states, reading the state to which the addressed cell was set by causing electrical current to flow through the addressed cell and simultaneously comparing a level of said current with two or more reference current levels.

10. The method of any one of claims 1–9 wherein the step of establishing a plurality of effective threshold voltage levels includes establishing at least four such threshold voltage levels.

11. The method of any one of claims 1–9 wherein the given threshold level of the individual cells is established to be at least three volts.

12. The method of any one of claims 3–5 which additionally comprises accumulating a count of the total number of times that the group of cells is preset.

13. The method of any one of claims 3–5 which additionally comprises, when said group of cells becomes unusable, substituting a redundant block of cells therefore within the array.

14. The method of any one of claims 1 or 3 which additionally comprises, in response to the addressed cell becoming defective, substituting therefore a redundant good cell within the array.

15. For an array of electrically alterable memory cells that are addressable for altering and reading their states, wherein the memory cells individually include a field effect transistor with a floating gate and has a threshold voltage level that is a given level in the absence of net charge on said floating gate but which is variable in accordance with an amount of net charge carried by said floating gate, a method of altering the state of an addressed cell of the array, comprising:

establishing a plurality of effective threshold voltage levels in excess of two that correspond to a plurality of individually detectable states of the cell in excess of two, setting the addressed cell to one of said plurality of detectable states by altering the amount of charge on the floating gate of the addressed cell until the effective threshold voltage of the addressed cell is substantially equal to one of said plurality of effective threshold voltage levels, and reading the state to which the addressed cell has been set by electrically interrogating the addressed cell and simultaneously comparing a resulting level of an electrical parameter of the addressed cell with a number of reference levels of two or more.

16. The method of claim 15 wherein the step of establishing a plurality of effective threshold voltage levels includes establishing at least four such threshold voltage levels.

17. The method of claim 15 wherein the given threshold level of the individual cells is established to be at least three volts.

18. In an array of a plurality of electrically erasable and programmable read only memory cells wherein individual cells are formed in a semiconductor substrate with a source and drain separated by a channel region, a floating gate positioned over at least a portion of and insulated from the channel region, and a control gate extending over and insulated from the floating gate, said transistor having an effective threshold voltage resulting from a combination of a natural threshold voltage and a voltage responsive to a controllable level of charge on the floating gate, wherein said natural threshold voltage corresponds to that when the floating gate has a level of charge equal to zero, a system for erasing, programming and reading the memory states of the cells in said array, comprising:

means operably connected to said array for addressing a selected one or group of the plurality of memory cells, erasing means operably connected to said array for driving the effective threshold voltage of an addressed cell or group of cells to a base level by altering the charge on each addressed cell's floating gate, programming means operably connected to said array for altering the charge on the floating gate of an addressed cell until its said effective threshold voltage is substantially equal to one of a plurality of effective threshold voltage levels in excess of two corresponding to a plurality of individual detectable states in excess of two, wherein at least two of said plurality of effective threshold voltage levels result from the controllable level of charge on the floating gate being positive, and reading means operably connected to said array for determining the amount of current that flows in an addressed cell, whereby the state of an addressed cell is determined from the measured current level therethrough.

19. The memory system according to claim 18 wherein said programming means includes means for altering the charge on the floating gate of an addressed cell until its effective threshold voltage is substantially equal to one of at least four effective threshold voltage levels, whereby individual cells of the array are programmable into four or more states.

20. The memory system according to claim 18 wherein said natural threshold voltage level is at least three volts.

21. The memory system according to claim 18 which additionally comprises means responsive to the erasing means driving the effective threshold voltage of said addressed cell or group of cells to a base level for incrementing by one a running count stored in the array of the number of times that said addressed cell or group of cells have been erased.

22. In an array of a plurality of electrically erasable and programmable read only memory cells wherein the memory cells individually include a field effect transistor having a source and drain formed in a semiconductor substrate and separated by a channel region, a floating gate positioned over at least a portion of and insulated from the channel region, and a control gate extending over and insulated from the floating gate, said transistor having an effective threshold voltage resulting from a combination of a natural threshold voltage and a voltage responsive to a controllable level of charge on the floating gate, wherein said natural threshold voltage corresponds to that when the floating gate has a level of charge equal to zero, a system for erasing, programming and reading the memory state of the cells in said array, comprising:

means operably connected to said array for addressing a selected one or group of the plurality of memory cells, erasing means operably connected to said array for driving the effective threshold voltage of an addressed cell or group of cells to a base level by altering the charge on the floating gates of the individual addressed cell's floating gate, programming means operably connected to said array for altering the charge on the floating gate of an addressed cell until its said effective threshold voltage is substantially equal to one of a plurality of effective threshold voltage levels in excess of two corresponding to a plurality of individual detectable states in excess of two, a plurality of reference sources providing a number of different reference current levels of two or more, means operably connected to said array for determining the amount of current that flows through an addressed cell, and means including a number of sense amplifiers of two or more for simultaneously comparing the amount of current flowing in an addressed cell with said number of reference current levels, whereby the state of an addressed cell is rapidly read.

23. The memory system of claim 22 wherein at least two of said plurality of effective threshold voltage levels within the programming means result from a net positive charge on the floating gate.

24. The memory system of claim 22 wherein a majority of said plurality of effective threshold voltage levels within the programming means result from a net positive charge on the floating gate.

25. The memory system of claim 22 wherein said programming means includes means for altering the charge on the floating gate of an addressed cell until its effective threshold voltage is substantially equal to one of at least four effective threshold voltage levels, whereby individual cells of the array are programmable into four or more states.

26. The memory system of claim 25 wherein said plurality of reference sources provides a number of different reference current levels of three or more.

27. The method of claim 1 which additionally comprises, after setting the detectable state of the addressed cell, reading the state to which the addressed cell was set by causing electrical current to flow through the addressed cell and simultaneously comparing a level of said current with a number of reference current levels that is one less than said plurality of effective threshold levels.

28. The method of claim 15 wherein reading the state to which the addressed cell has been set includes simultaneously comparing the resulting electrical parameter level with a number of reference levels that is one less than said plurality of states.

29. The method of claim 15 wherein reading the state to which the addressed cell has been set includes electrically interrogating the addressed cell by causing electrical current to flow therethrough and simultaneously comparing a level of said current with a number of reference current levels of two or more.

30. The method of claim 29 wherein reading the state to which the addressed cell has been set includes simultaneously comparing the level of said current with a number of reference current levels that is one less than said plurality of states.

31. The memory system according to claim 18, wherein the reading means includes means providing a number of reference current levels of two or more for simultaneously comparing the amount of current that flows in an addressed cell with said reference levels.

32. The memory system according to claim 31, wherein said means providing a number of reference current levels includes a number of reference current levels that is one less than said plurality of effective threshold voltage levels.

33. For an array of electrically alterable memory cells divided into distinct blocks of cells and having means for addressing individual cells within said blocks to read and alter their states, said memory cells individually including a field effect transistor with a floating gate and having a threshold voltage level that is a given level in the absence of net charge on said floating gate but which is variable in accordance with an amount of net charge carried by said floating gate, a method of operating the array, comprising the steps of:

establishing a plurality of effective threshold voltage levels in excess of two that correspond to a plurality of detectable states of the individual cells in excess of two, setting the effective threshold voltage level of each of a plurality of memory cells within one of said blocks by altering the amount of charge on the floating gate of said each of the cells until the effective threshold voltage thereof is substantially equal to one of said plurality of effective threshold voltage levels, whereby the states of said plurality of cells are individually set to be within one of said plurality of states, and reading the states of said plurality of memory cells with assistance of an error correction scheme.

34. For an array of electrically alterable memory cells divided into distinct blocks of cells and having means for addressing individual cells within said blocks to read and alter their states, said memory cells individually including a field effect transistor with a floating gate and having a threshold voltage level that is a given level in the absence of net charge on said floating gate but which is variable in accordance with an amount of net charge carried by said floating gate, a method of operating the array, comprising the steps of:

establishing a plurality of effective threshold voltage levels in excess of two that correspond to a plurality of detectable states of the individual cells in excess of two, simultaneously erasing the cells within an addressed one of said distinct blocks, after the erase operation is performed, determining whether there are any unerased cells within said one block and, if so, a number of such unerased cells, comparing the number of unerased cells with a permitted number, said permitted number being substantially the maximum number of cells whose data, if bad, are correctable by an error correction scheme, if the number of unerased cells within said one block is less than said permitted number, reprogramming memory cells within the erased one block with new data, if the number of unerased cells within said one block is greater than said permitted number, substituting other redundant memory cells for the unerased memory cells and reprogramming the redundant memory cells with at least some of the new data, and accomplishing said reprogramming by setting the effective threshold voltage level of individual ones of the memory cells being reprogrammed to one of said plurality of levels by altering the amount of charge on the floating gates of said individual ones of the memory cells being reprogrammed until the effective threshold voltages thereof are substantially equal to one of said plurality of effective threshold voltage levels, whereby the reprogrammed memory cells are individually set to one of said plurality of states.

* * * * *